United States Patent
Wu et al.

(10) Patent No.: US 7,844,927 B2
(45) Date of Patent: Nov. 30, 2010

(54) METHOD FOR QUALITY ASSURED SEMICONDUCTOR DEVICE MODELING

(75) Inventors: Zhi-Yuan Wu, Union City, CA (US); Ali Icel, Cupertino, CA (US); Judy X. An, San Jose, CA (US); Ciby T. Thuruthiyil, Fremont, CA (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 369 days.

(21) Appl. No.: 11/655,534

(22) Filed: Jan. 19, 2007

(65) Prior Publication Data

US 2008/0177523 A1 Jul. 24, 2008

(51) Int. Cl.
*G06F 17/50* (2006.01)
(52) U.S. Cl. ............... 716/4; 716/5; 716/6; 703/14
(58) Field of Classification Search .............. 716/4–6; 703/14
See application file for complete search history.

(56) References Cited

U.S. PATENT DOCUMENTS

| | | | | |
|---|---|---|---|---|
| 5,239,481 | A * | 8/1993 | Brooks et al. ............ | 716/6 |
| 5,648,920 | A * | 7/1997 | Duvvury et al. .......... | 716/20 |
| 5,790,436 | A | 8/1998 | Chen | |
| 5,966,527 | A * | 10/1999 | Krivokapic et al. ....... | 703/14 |
| 6,141,632 | A | 10/2000 | Smith | |
| 6,314,390 | B1 * | 11/2001 | Bittner et al. ............ | 703/14 |
| 6,470,230 | B1 * | 10/2002 | Toprac et al. ............ | 700/121 |
| 6,560,568 | B1 | 5/2003 | Singhal | |
| 6,772,035 | B2 * | 8/2004 | Mouli ..................... | 700/121 |
| 6,795,800 | B1 | 9/2004 | Lee | |
| 6,850,877 | B1 | 2/2005 | Sengupta | |
| 6,959,271 | B1 | 10/2005 | Ballam | |
| 7,162,402 | B2 * | 1/2007 | Daems et al. ............ | 703/13 |
| 7,171,346 | B1 * | 1/2007 | Recker et al. ............ | 703/14 |
| 2003/0200071 | A1 * | 10/2003 | Zhang et al. ............. | 703/15 |

OTHER PUBLICATIONS

McAndrew; "Statistical modeling for circuit simulation"; Fourth International Symposium on Mar. 24-26, 2003; pp. 357-362.*
Huang et al.; "An accurate gate length extraction method for sub-quarter micron MOSFET's"; IEEE Transactions on Electron Devices; vol. 43; No. 6; pp. 958-964; Jun. 1996.*

* cited by examiner

*Primary Examiner*—Naum B Levin
(74) *Attorney, Agent, or Firm*—Farjami & Farjami LLP

(57) ABSTRACT

According to one exemplary embodiment, a method for producing a quality assured semiconductor device model when at least one critical parameter of a semiconductor device process is upgraded includes verifying the quality assured semiconductor device model for consistency against measured data or projected targets. The method further includes verifying the quality assured semiconductor device model for accuracy and consistency when one of a number of critical parameters is varied. The method further includes verifying consistency of the quality assured semiconductor device model against an old semiconductor device model. The method further includes verifying the quality assured semiconductor device model over a range of each of a number of semiconductor device dependencies. The method further includes verifying the quality assured semiconductor device model for digital circuit operation. The method further includes verifying the quality assured semiconductor device model for analog circuit operation. The method further includes verifying convergence of the quality assured semiconductor device model.

20 Claims, 2 Drawing Sheets

METHOD FOR QUALITY ASSURED SEMICONDUCTOR DEVICE MODELING

1. TECHNICAL FIELD

The present invention is generally in the field of semiconductors. More particularly, the invention is in the field of semiconductor device modeling.

2. BACKGROUND ART

Semiconductor device models, such as transistor models, are vital in achieving reliable performance from circuit designs using semiconductor devices. Moreover, semiconductor device models can significantly increase the efficiency of the circuit design process. As such, it is desirable to ensure the accuracy of such semiconductor device models.

Conventional methods for generating semiconductor device models typically include building a "model card" (also referred to simply as a "model" in the present application) for the semiconductor device by extracting device parameters from a measured data set. Simulation data provided by the semiconductor device model is then compared to measured data obtained from fabricated semiconductor devices to verify the accuracy of the semiconductor device model. However, due to time and cost constraints, the measured data that is utilized for semiconductor device model verification in a conventional model verification process is typically obtained from a relatively small number of fabricated semiconductor devices. Consequently, the conventional semiconductor device model verification process may not provide sufficient assurance of semiconductor device model accuracy.

SUMMARY

A method for quality assured semiconductor device modeling, substantially as shown in and/or described in connection with at least one of the figures, and as set forth more completely in the claims.

DETAILED DESCRIPTION OF THE INVENTION

The present invention is directed to a method for quality assured semiconductor device modeling. The following description contains specific information pertaining to the implementation of the present invention. One skilled in the art will recognize that the present invention may be implemented in a manner different from that specifically discussed in the present application. Moreover, some of the specific details of the invention are not discussed in order not to obscure the invention.

The drawings in the present application and their accompanying detailed description are directed to merely exemplary embodiments of the invention. To maintain brevity, other embodiments of the present invention are not specifically described in the present application and are not specifically illustrated by the present drawings.

Figure 1:
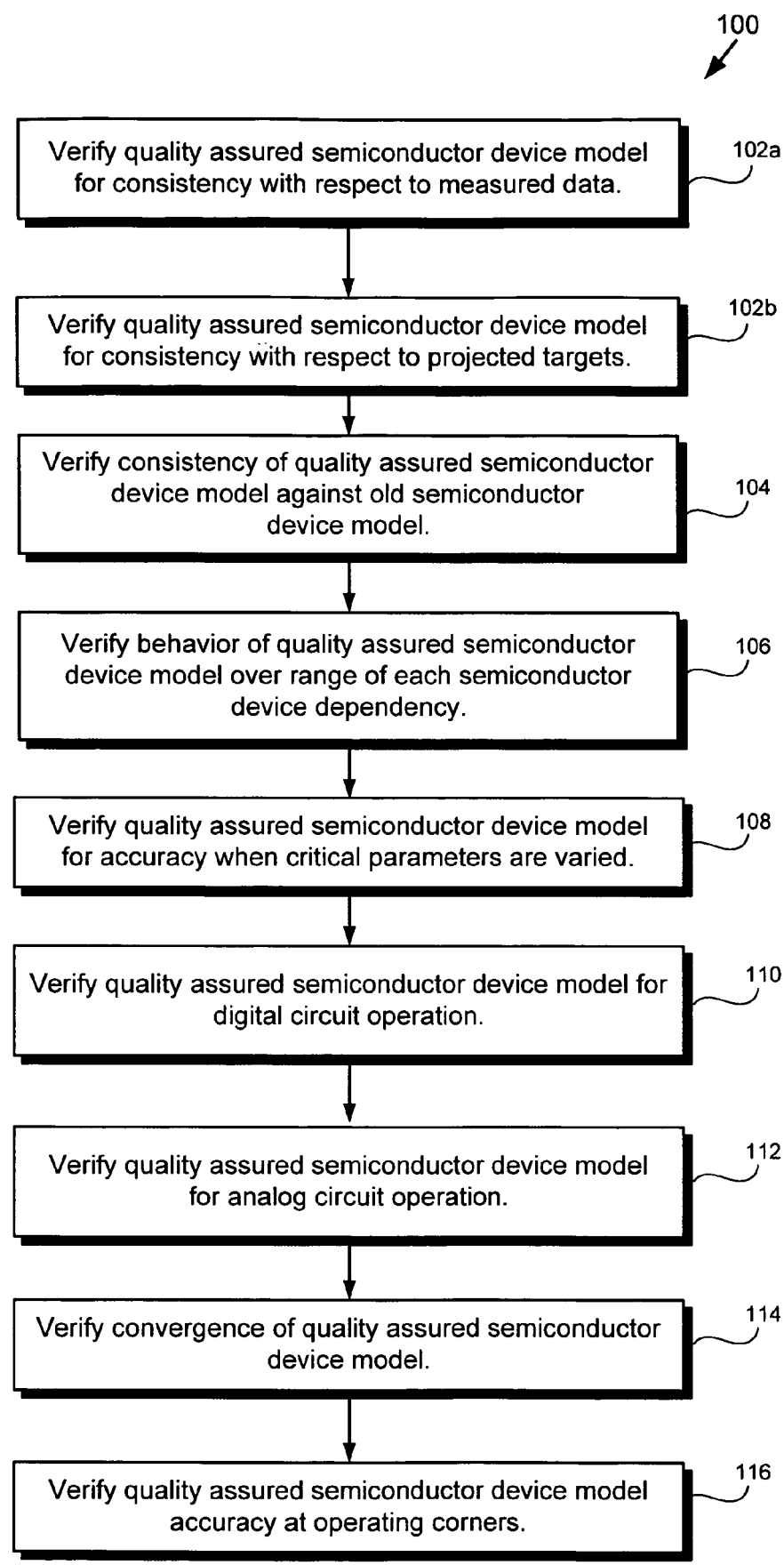
FIG. 1 shows a flowchart illustrating typical steps taken to implement an embodiment of the present invention.

FIG. 1 shows a flowchart illustrating a method for producing a quality assured semiconductor device model in accordance with one embodiment of the present invention. Certain details and features have been left out of flowchart 100 that are apparent to a person of ordinary skill in the art. For example, a step may consist of one or more substeps or may involve specialized equipment or materials, as known in the art. While steps 102a, 102b, 104, 106, 108, 110, 112, 114, and 116 indicated in flowchart 100 are sufficient to describe one embodiment of the present invention, other embodiments of the invention may utilize steps different from those shown in flowchart 100.

Referring now to steps 102a and 102b in FIG. 1, at steps 102a and 102b of flowchart 100, a quality assured semiconductor device model (also referred to simply as a "quality assured model" in the present application) is verified for consistency with respect to measured data. In the present embodiment, the semiconductor device being modeled can be a field effect transistor (FET) model, such as a metal oxide semiconductor FET (MOSFET). However, the method of the present invention can also be utilized to achieve a quality assured model of a semiconductor device other than a FET. In the present embodiment, the quality assured model can be a quality assured "SPICE" (Simulation Program for Integrated Circuits Emphasis) model, for example. "SPICE" refers to a general purpose circuit simulator that is used in the art to verify circuit designs and to predict the circuit behavior. However, it is noted that, as readily apparent from the present application, the invention is not in any manner limited to a SPICE model.

The quality assured model can be generated based on data obtained from fabricated semiconductor devices, such as fabricated FETs. In one embodiment, the quality assured model can be generated based on targets, which can include specific electrical parameters that can be extracted from previously fabricated semiconductor devices, such as previously fabricated FETs. The quality assured model can be verified for consistency against measured data (step 102a) or projected targets (step 102b) derived from one or more fabricated FETs, for example. For example, the electrical parameters, such as threshold voltage (Vt), drive current, leakage current, gate and junction capacitance, can be measured and verified against semiconductor device dependencies, such as channel width (W), channel length (L), temperature (T), applied voltages (Vdd), and body/substrate (i.e. body bias) voltages. Thus, for example, FETs having a specific W (channel width), L (channel length), or T (temperature) range in the quality assured model should provide a similar dependence for drive current or other key device parameters (Vt, Ioff, etc.) that is consistent with silicon data (measured data) or model targets (projected targets).

At step 104 of flowchart 100, the consistency of the invention's quality assured model is verified against an old, i.e., a previous, semiconductor device model. For example, the consistency of electrical parameters, such as Vt, drive current, leakage current, and junction capacitance of the quality assured model can be verified against the old semiconductor device model with respect to semiconductor device dependencies, such as W, L, T, and Vdd. Thus, for example, a change in a semiconductor device dependency, such as W, in the quality assured model should result in a consistent change in an electrical parameter, such as drive current, in the quality assured model compared to the drive current of the old semiconductor device model. The invention's quality assured model can be appropriately corrected if an inconsistency is discovered during verification of the quality assured model against the old semiconductor device model.

At step 106 of flowchart 100, the behavior of the invention's quality assured model is verified for accuracy over a range of semiconductor device dependencies. For example, the accuracy of the quality assured model with respect to electrical parameters, such as Vt, drive current, and junction capacitance, can be verified over a range of W (channel width), a range of L (channel length), a range of T (temperature), and a range of Vdd (supply voltage). For example, the quality assured model can be verified to be accurately scaling between different Vt, such as low Vt, regular Vt, and high Vt with respect to ranges of W, L, T, and Vdd. By verifying accuracy with respect to a range of a semiconductor device dependency, the invention's quality assured model can be ensured to accurately scale over the entire range of the semiconductor device dependency. Thus, for example, the invention's quality assured model can be ensured to accurately scale over an entire range of W that may be utilized by a circuit designer. Thus, the invention's quality assured model can be verified to advantageously provide accurate FET behavior over one or more entire ranges of semiconductor device dependencies.

At step 108 of flowchart 100, the invention's quality assured model is verified for accuracy when critical parameters are varied. Critical parameters can include, for example, W, L, gate CD (critical dimension), and gate oxide thickness. For example, if gate oxide thickness is decreased, the quality assured model can be verified to provide an increase in drain current that is consistent with the decrease in gate oxide thickness. A critical parameter, such as gate oxide thickness or gate CD, can be upgraded to provide increased performance in a semiconductor device, such as a FET. Thus, the quality assured model can be verified to provide an accurate increase in an electrical parameter, such as drain current, to indicate a corresponding increase in semiconductor device performance when a critical parameter, such as gate oxide thickness, is upgraded.

At step 110 of flowchart 100, the invention's quality assured model is verified for digital circuit operation. For example, in a digital circuit such as a ring oscillator, the invention's quality assured model can be verified for consistency of delay vs. standby current or dynamic leakage current or delay vs. static leakage current with respect to variations in critical parameters, such as variations in gate oxide thickness, W, or L. In the ring oscillator, the quality assured model can also be verified for consistency of delay vs. dynamic leakage current or delay vs. static leakage current with respect to variations in Vt (threshold voltage) for a particular critical parameter, such as a particular W or L, for example. In one embodiment, the ring oscillator can be loaded by being coupled to backend interconnect resistor(s) and capacitor(s) during the verification process. In other embodiments, invention's quality assured model can be verified for consistency in operation in digital circuits including combinations of digital devices, such as inverters, NAND gates, NOR gates, inverters, and multiplexers. Other examples include verification for digital circuit operations in relation to, for example, critical paths, ROs, and hysteresis.

At step 112 of flowchart 100, the invention's quality assured model is verified for analog circuit operation. For example, in an analog circuit, the invention's quality assured model can be verified for consistency of electrical parameters related to analog circuits, such as transconductance (gm), output resistance (Rout), and drain current, with respect to the semiconductor device dependencies, such as W, L, T, and Vdd. For example, for analog circuit operation, the quality assured model can be verified for consistency of Rout (output resistance) vs. W (channel width), Rout vs. L (channel length), Rout vs. T (temperature), and Rout vs. Vdd (supply voltage). Other examples include verification for analog circuit operations in relation to, for example, mismatch and op-amp gain.

At step 114 of flowchart 100, the invention's quality assured model is verified for convergence with a farm of design circuits including benchmark circuits, digital critical paths, and/or analog circuit blocks. For example, an input file including a set of electrical parameters and semiconductor device dependencies can be run with the quality assured model to verify that the quality assured model converges, i.e., generates meaningful results. If the quality assured model does not converge, the cause of the lack of convergence can be determined and appropriately corrected. For example, if the lack of convergence is caused by a problem in the quality assured model, it, i.e., the quality assured model, can be debugged. For example, if the problem is in the input file, the set of electrical parameters and semiconductor device dependencies can be checked to insure that they are within specified boundaries.

At step 116 of flowchart 100, the invention's quality assured model is verified for accuracy at operating corners. During a semiconductor device fabrication process, such as a FET fabrication process, the wafer, such as a silicon wafer, can vary in thickness, for example. The variations in the wafer can be referred to as operating corners, which can be classified as slow, regular, and fast operating corners. Each type of operating corner, e.g., slow, regular, or fast operating corner, can cause have a different effect on semiconductor device operation. Thus, the invention's quality assured model can be verified for accuracy of electrical parameters, such as drive current, Vt, leakage current, gate and junction capacitance, subthreshold slope, hysteresis, transconductance (Gm), and output resistance (Rout) vs. semiconductor device dependencies, e.g., W, L, T, and Vdd, with respect to slow, regular, and fast operating corners.

As a result of the verification steps in the invention's method discussed above, the invention achieves a quality assured semiconductor device model, such as a quality assured FET model, that provides accurate results over a range of semiconductor device dependencies, such as W, L, T, and Vdd, and over variations in critical parameters, such as gate oxide thickness, and gate CD, for example. Also, the method of the invention achieves a quality assured semiconductor device model that advantageously provides consistent operation in digital circuits and in analog circuits. Additionally, the method of the invention achieves a quality assured semiconductor device model that advantageously converges and is accurate at operating corners. As such, the invention's quality assured semiconductor device model can facilitate device and circuit simulations with increased accuracy, thereby resulting in improved fabrication of semiconductor chips (also referred to as "semiconductor dies" in the present application) and providing increased circuit design efficiency.

Figure 2:
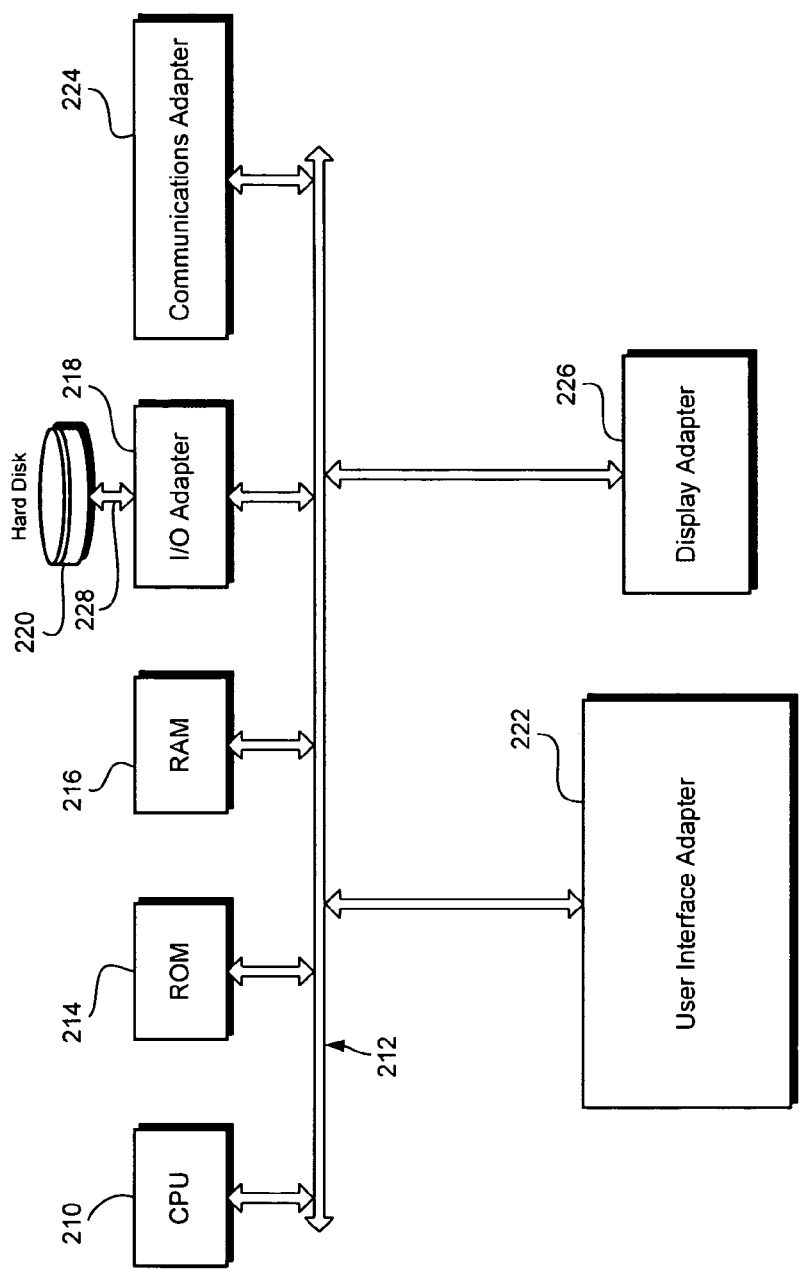
FIG. 2 shows a block diagram of an exemplary programmed computer which can be utilized to implement an embodiment of the present invention's method.

FIG. 2 shows computer 200 for implementing a method for producing a quality assured semiconductor device model in accordance with one embodiment of the present invention. For the purpose of an example, computer 200 shows a typical computer which can be programmed to run the invention's method for producing a quality assured semiconductor device model illustrated in flowchart 100 in FIG. 1. Computer 200 (also referred to as "programmed computer") includes central processing unit (CPU) 210, bus 212, read only memory (ROM) 214, random access memory (RAM) 216, input/output (I/O) adapter 218, hard drive 220, user interface adapter 222, communications adapter 224, and display adapter 226. Computer 200 can also include a compact disk (CD), a digital video disk (DVD), and a flash memory storage device, which are not shown in FIG. 2, as well as other computer-readable media as known in the art.

As shown in FIG. 2, CPU 210, ROM 214, RAM 216, I/O adapter 218, communications adapter 224, user interface adapter 222, and display adapter 226 are coupled to bus 212, which provides a communications conduit for the above devices. User interface adapter 222 is typically coupled to an input device such as a keyboard (not shown in FIG. 2) to permit a user to communicate with and control the computer. Display adapter 226 is typically coupled to a monitor (not shown in FIG. 2) for the purpose of communicating and interacting with the user. Also shown in FIG. 2, hard disk 220 is coupled to I/O adapter 218 via bus 228, which allows hard disk 220 and I/O adapter 218 to communicate.

In computer 200, program code (also referred to simply as "code") for executing the invention's method of producing a quality assured semiconductor device model, such an embodiment of the invention's method shown in flowchart 100 in FIG. 1, can be contained in a computer-readable medium such as ROM 214, RAM 216, hard disk 220, a CD (not shown in FIG. 2), a DVD (not shown in FIG. 2), or a flash memory storage device (not shown in FIG. 2), for example.

Computer 200 shown in FIG. 2 may be a work station, for example, which uses a 32-bit, 64-bit, a dual-core, or a multi-core CPU, as known in the art. Computer 200 can be a personal computer, a mini-computer, or a mainframe as well. However, it is understood and appreciated by those skilled in the art that the invention's method of producing a quality assured semiconductor device model may also be implemented using a variety of different types of computers other than those specifically mentioned herein.

As discussed above, the invention achieves a quality assured semiconductor device model having increased modeling accuracy. As such, the invention achieves a quality assured semiconductor device model that can significantly improve the efficiency of semiconductor circuit design, thereby advantageously reducing the manufacturing cost of semiconductor circuits. Due to the improved accuracy of the invention's method in achieving a quality assured semiconductor device model as described above, the design, simulation, and/or fabrication of physical semiconductor devices can be significantly improved. In other words, results obtained from the invention's improved semiconductor device modeling can be utilized to aid engineers to significantly improve the design, simulation, and/or fabrication of semiconductor chips and circuits resulting in an increase in production yield.

From the above description of the invention it is manifest that various techniques can be used for implementing the concepts of the present invention without departing from its scope. Moreover, while the invention has been described with specific reference to certain embodiments, a person of ordinary skill in the art would appreciate that changes can be made in form and detail without departing from the spirit and the scope of the invention. Thus, the described embodiments are to be considered in all respects as illustrative and not restrictive. It should also be understood that the invention is not limited to the particular embodiments described herein but is capable of many rearrangements, modifications, and substitutions without departing from the scope of the invention.

Thus, a method for quality assured semiconductor device modeling has been described.

The invention claimed is:

1. A method for producing a quality assured semiconductor device model when at least one semiconductor device dimension is upgraded, said method comprising the steps of:
   verifying, by a programmed computer, said quality assured semiconductor device model for consistency with respect to measured data derived from at least one fabricated semiconductor device;
   verifying, by said programmed computer, said quality assured semiconductor device model for accuracy in providing a change in an electrical parameter corresponding to a variation in one of a plurality of semiconductor device dimensions.

2. The method of claim 1 further comprising using said quality assured semiconductor device model to fabricate a semiconductor chip.

3. The method of claim 1 further comprising using said quality assured semiconductor device model for semiconductor chip design.

4. A computer-readable storage device containing code for executing the method of claim 1.

5. A computer-readable storage device containing code for executing the method of claim 1 by said programmed computer, said computer-readable storage device being selected from the group consisting of a compact disk (CD), a digital video disk (DVD), a flash memory storage device, a hard disk, a random access memory (RAM), and a read only memory (ROM).

6. The method of claim 1, wherein said one of said plurality of semiconductor device dimensions is selected from the group consisting of channel width, channel length, and gate oxide thickness.

7. The method of claim 1 further comprising verifying by said programmed computer consistency of said quality assured semiconductor device model against an existing semiconductor device model.

8. The method of claim 1 further comprising verifying, by said programmed computer, said quality assured semiconductor device model over a range of each of a plurality of semiconductor device dependencies.

9. The method of claim 8, wherein said plurality of semiconductor device dependencies comprises channel width, channel length, temperature, applied voltage, and body bias.

10. The method of claim 1 further comprising verifying, by said programmed computer, convergence of said quality assured semiconductor device model.

11. The method of claim 1, wherein said step of verifying, by said programmed computer, said quality assured semiconductor device model for consistency against measured data comprises verifying consistency of a plurality of electrical parameters against each of a plurality of semiconductor device dependencies.

12. The method of claim 11, wherein said plurality of electrical parameters comprises threshold voltage (Vt), drive current, leakage current, subthreshold slope, gate and junction capacitance, transconductance (Gm), output resistance (Rout), and hysteresis.

13. The method of claim 11, wherein said plurality of semiconductor device dependencies comprises channel width, channel length, temperature, applied voltage, and body bias.

14. The method of claim 1, wherein said quality assured semiconductor device model is a quality assured FET model.

15. A programmed computer for executing code for validating a quality assured semiconductor device model when at least one semiconductor device dimension is upgraded, said programmed computer including a computer-readable storage device, a central processing unit (CPU), and a user interface adapter, said programmed computer executing said code to implement a method comprising the steps of:

verifying said quality assured semiconductor device model for Consistency with respect to measured data from at least one fabricated semiconductor device;

verifying said quality assured semiconductor device model for accuracy in providing a change in an electrical parameter corresponding to a variation in one of a plurality of semiconductor device dimensions.

16. The programmed computer of claim 15, wherein said one of said plurality of semiconductor device dimensions is selected from the group consisting of channel width, channel length, and gate oxide thickness.

17. The programmed computer of claim 15, wherein said method further comprises verifying said quality assured semiconductor device model over a range of each of a plurality of semiconductor device dependencies.

18. The programmed computer of claim 17, wherein said plurality of semiconductor device dependencies comprises channel width, channel length, temperature, and applied voltage.

19. The programmed computer of claim 15, wherein said method further comprises verifying said quality assured semiconductor device model for digital circuit operation.

20. The programmed computer of claim 15, wherein said method further comprises verifying said quality assured semiconductor device model for analog circuit operation.

* * * * *